United States Patent
Zhang

(10) Patent No.: US 11,942,560 B2
(45) Date of Patent: Mar. 26, 2024

(54) SEMICONDUCTOR DEVICE STRUCTURES AND METHODS OF MANUFACTURING THE SAME

(71) Applicant: INNOSCIENCE (ZHUHAI) TECHNOLOGY CO., LTD., Zhuhai (CN)

(72) Inventor: Anbang Zhang, Zhuhai (CN)

(73) Assignee: INNOSCIENCE (ZHUHAI) TECHNOLOGY CO., LTD., Guangdong (CN)

( * ) Notice: Subject to any disclaimer, the term of this patent is extended or adjusted under 35 U.S.C. 154(b) by 648 days.

(21) Appl. No.: 15/734,550

(22) PCT Filed: Aug. 13, 2020

(86) PCT No.: PCT/CN2020/108833
§ 371 (c)(1),
(2) Date: Dec. 2, 2020

(87) PCT Pub. No.: WO2022/032558
PCT Pub. Date: Feb. 17, 2022

(65) Prior Publication Data
US 2022/0052207 A1    Feb. 17, 2022

(51) Int. Cl.
*H01L 29/417*    (2006.01)
*H01L 21/8252*    (2006.01)
(Continued)

(52) U.S. Cl.
CPC ........ *H01L 29/872* (2013.01); *H01L 21/8252* (2013.01); *H01L 27/0629* (2013.01);
(Continued)

(58) Field of Classification Search
None
See application file for complete search history.

(56) References Cited

U.S. PATENT DOCUMENTS 7,538,366 B2 * 5/2009 Saito .................. H01L 29/7787
257/E33.028
2011/0272708 A1 * 11/2011 Yoshioka .......... H01L 21/28264
257/77
(Continued)

FOREIGN PATENT DOCUMENTS

| CN | 105322008 A | 2/2016 |
| CN | 107978642 A | 5/2018 |
| CN | 109950324 A | 6/2019 |

OTHER PUBLICATIONS

First Office Action of the corresponding China patent application No. 202080002651.8 dated Apr. 22, 2021.

*Primary Examiner* — Bilkis Jahan
(74) *Attorney, Agent, or Firm* — JCIPRNET

(57) ABSTRACT

A semiconductor device structure and a method for manufacturing the same are provided. The semiconductor device structure includes a substrate, a first nitride semiconductor layer, a second nitride semiconductor layer, a third nitride semiconductor layer, a first electrode and a second electrode. The first nitride semiconductor layer is disposed on the substrate. The second nitride semiconductor layer is disposed on the first nitride semiconductor layer. The third nitride semiconductor layer is disposed on the second nitride semiconductor layer. The first electrode is disposed on the second nitride semiconductor layer and spaced apart from the third nitride semiconductor layer. The second electrode covers an upper surface of the third nitride semiconductor layer and is in direct contact with the first nitride semiconductor layer.

17 Claims, 16 Drawing Sheets

(51) Int. Cl.
*H01L 27/06* (2006.01)
*H01L 29/66* (2006.01)
*H01L 29/868* (2006.01)
*H01L 29/872* (2006.01)
*H01L 29/20* (2006.01)
*H01L 29/205* (2006.01)

(52) U.S. Cl.
CPC ...... *H01L 29/417* (2013.01); *H01L 29/66143* (2013.01); *H01L 29/868* (2013.01); *H01L 29/2003* (2013.01); *H01L 29/205* (2013.01)

(56) References Cited

U.S. PATENT DOCUMENTS

| | | | |
|---|---|---|---|
| 2012/0146093 A1* | 6/2012 | Shibata | H01L 29/7786 257/192 |
| 2018/0358458 A1* | 12/2018 | Iucolano | H01L 29/1066 |
| 2019/0081167 A1* | 3/2019 | Chen | H01L 29/42372 |
| 2019/0096879 A1* | 3/2019 | Chen | H01L 27/0629 |
| 2020/0350427 A1* | 11/2020 | Jiang | H01L 27/0629 |

\* cited by examiner

SEMICONDUCTOR DEVICE STRUCTURES AND METHODS OF MANUFACTURING THE SAME

BACKGROUND

1. Field of the Disclosure

The present disclosure relates to a semiconductor device structure, and more particularly, to a semiconductor device structure integrating a Schottky diode and a PIN diode.

2. Description of Related Art

Components including direct bandgap semiconductors, for example, semiconductor components including group III-V materials or group III-V compounds (Category: III-V compounds) can operate or work under a variety of conditions or in a variety of environments (e.g., at different voltages and frequencies).

The semiconductor components may include a heterojunction bipolar transistor (HBT), a heterojunction field effect transistor (HFET), a high-electron-mobility transistor (HEMT), a modulation-doped FET (MODFET) and the like.

SUMMARY

According to some embodiments of the present disclosure, a semiconductor device structure includes a substrate, a first nitride semiconductor layer, a second nitride semiconductor layer, a third nitride semiconductor layer, a first electrode and a second electrode. The first nitride semiconductor layer is disposed on the substrate. The second nitride semiconductor layer is disposed on the first nitride semiconductor layer. The third nitride semiconductor layer is disposed on the second nitride semiconductor layer. The first electrode is disposed on the second nitride semiconductor layer and spaced apart from the third nitride semiconductor layer. The second electrode covers an upper surface of the third nitride semiconductor layer and is in direct contact with the first nitride semiconductor layer.

According to some embodiments of the present disclosure, a semiconductor device structure includes a substrate, a first device and a second device. The first device is disposed on the substrate. The first device includes a first nitride semiconductor layer, a second nitride semiconductor, a third nitride semiconductor layer, a first electrode and a second electrode. The first nitride semiconductor layer is disposed on the substrate. The second nitride semiconductor layer is disposed on the first nitride semiconductor layer. The third nitride semiconductor layer is disposed on the second nitride semiconductor layer. The first electrode is spaced apart from the third nitride semiconductor layer. The second electrode is in direct contact with the third nitride semiconductor layer and the first nitride semiconductor layer. The second device is disposed on the substrate and electrically connected to the first device.

According to some embodiments of the present disclosure, a method of manufacturing a semiconductor device structure includes: providing a substrate; forming a first nitride semiconductor layer on the substrate; forming a second nitride semiconductor layer on the first nitride semiconductor layer; forming a third nitride semiconductor layer on the second nitride semiconductor layer; forming a first electrode on the second nitride semiconductor layer; forming an opening penetrating the second nitride semiconductor layer and exposing the first nitride semiconductor layer; and forming a second electrode to cover an upper surface of the third nitride semiconductor layer and fill the opening, such that the second electrode is in contact with both the first nitride semiconductor layer and the third nitride semiconductor layer.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Figure 1:
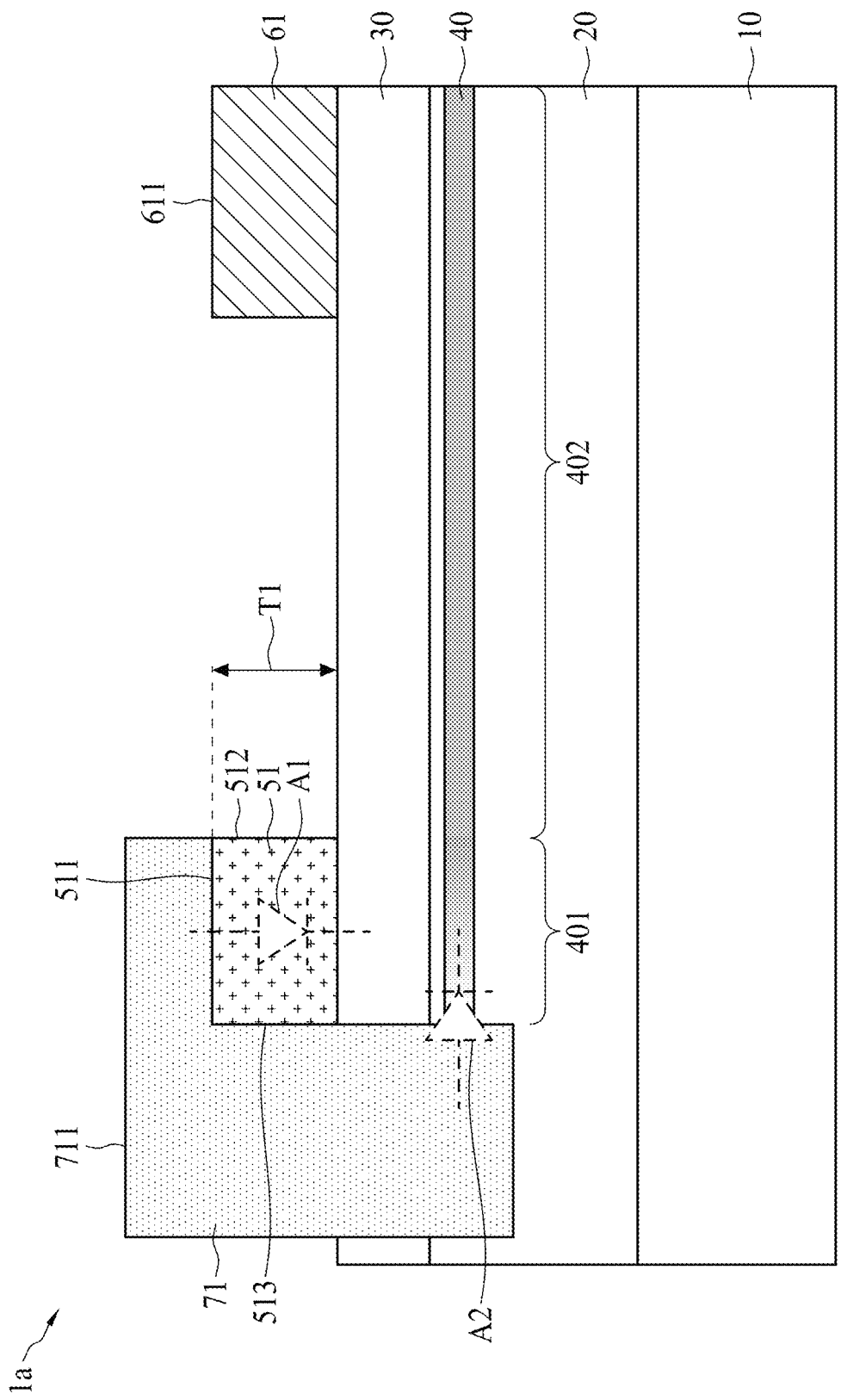
FIG. 1 is a cross-sectional view of a semiconductor device structure in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail as follows. It should be appreciated, however, that the present disclosure provides many applicable concepts that can be embodied in a wide variety of specific contexts. The specific embodiments discussed are merely illustrative and do not limit the scope of the disclosure.

FIG. 1 is a cross-sectional view of a semiconductor device structure 1a in accordance with some embodiments of the present disclosure.

As shown in FIG. 1, the semiconductor device structure 1a may include a substrate 10, a channel layer 20, a barrier layer 30, a group III-V layer 51, an electrode 61 and an electrode 71. The semiconductor device structure 1a may function as a diode component.

The substrate 10 may include, without limitation, silicon (Si), doped Si, silicon carbide (SiC), germanium silicide (SiGe), gallium arsenide (GaAs), or other semiconductor materials. The substrate 10 may include, without limitation, sapphire, silicon on insulator (SOI), or other suitable materials.

The channel layer 20 (or a nitride semiconductor layer) is disposed on the substrate 10. The channel layer 20 may include a group III-V layer. The channel layer 20 may include, but is not limited to, a group III nitride, for example, a compound $In_xAl_yGa_{1-x-y}N$, in which $x+y \leq 1$. The group III nitride further includes, but is not limited to, for example, a compound $Al_yGa_{(1-y)}N$, in which $y \leq 1$. The channel layer 20 includes a gallium nitride (GaN) layer. GaN has a band gap of about 3.4 eV. The thickness of the channel layer 20 ranges, but is not limited to, from about 0.5 μm to about 10 μm.

The barrier layer 30 (or a nitride semiconductor layer) is disposed on the channel layer 20. The barrier layer 30 may include a group III-V layer. The barrier layer 30 may include, but is not limited to, a group III nitride, for example, a compound $In_xAl_yGa_{1-x-y}N$, in which $x+y \leq 1$. The group III nitride further includes, but is not limited to, for example, a compound $Al_yGa_{(1-y)}N$, in which $y \leq 1$. The barrier layer 30 has a greater bandgap than that of the channel layer 20. The barrier layer 30 includes an aluminum gallium nitride (AlGaN) layer. AlGaN has a band gap of about 4.0 eV. The thickness of the barrier layer 30 ranges, but is not limited to, from about 10 nm to about 100 nm.

A heterojunction is formed between the barrier layer 30 and the channel layer 20, and the polarization of the heterojunction of different nitrides forms a 2DEG region 40 in the channel layer 20. The 2DEG region 40 is typically formed in a layer with a small bandgap, such as GaN.

The group III-V layer 51 (or a nitride semiconductor layer) is disposed on the barrier layer 30. The group III-V layer 51 is in direct contact with the barrier layer 30. The group III-V layer 51 may include p-type dopants. It is contemplated that the group III-V layer 51 may include a p-doped GaN layer, p-doped AlGaN layer, p-doped AlN layer or other suitable III-V group layers. The p-type dopants may include at least one of magnesium (Mg), beryllium (Be), zinc (Zn) and cadmium (Cd).

The group III-V layer 51 may control the concentration of the 2DEG region 40. The group III-V layer 51 can be used to deplete the electrons of the 2DEG region 40 directly under the group III-V layer 51. The thickness of the group III-V layer 51 may range from about 30 nm to about 50 nm. The thickness of the group III-V layer 51 may range from about 50 nm to about 70 nm. The thickness of the group III-V layer 51 may range from about 70 nm to about 100 nm.

As shown in FIG. 1, the 2DEG region 40 may include a region 401 in which some electrons are depleted and a region 402 in which electrons are substantially not depleted. The region 401 is not completely depleted. The region 401 may have a gradient concentration of 2DEG, e.g. with a lesser concentration abutting the electrode 71 and a greater concentration far from the electrode 71. The region 401 may also be referred to as a low density 2DEG region. The region 402 may also be referred to as a high density 2DEG region.

The group III-V layer 51 may have a surface 511 (or an upper surface), a surface 512 (or a side surface) and a surface 513 (or a side surface). The surface 511 may be away from the barrier layer 30. The surface 512 is adjacent to the electrode 61. The surface 513 is opposite to the surface 512 and far from the electrode 61. The surface 513 is adjacent to the electrode 71.

The electrode 61 is disposed on the barrier layer 30. The electrode 61 is spaced apart from the group III-V layer 51. The electrode 61 may include titanium (Ti), aluminum (Al), nickel (Ni), copper (Cu), gold (Au), platinum (Pt), palladium (Pd), tungsten (W), titanium nitride (TiN) or other suitable materials. The electrode 61 may include a single layer structure. The electrode 61 may be a multilayer structure. For example, the electrode 61 may include a lower layer including Ti or TiN and an upper layer including Ti, Al, Ni, Cu, TiN, Au, Pt, Pd, W or an alloy thereof. The electrode 61 may function as a cathode of a diode.

The electrode 61 may have a surface 611. The surface 611 may also be referred to as an upper surface of the electrode 61. The surface 611 of the electrode 61 may be elevationally the same as the surface 511 of the group III-V layer 51. The surface 611 of the electrode 61 may be higher than the surface 511 of the group III-V layer 51. The surface 611 of the electrode 61 may be lower than the surface 511 of the group III-V layer 51.

The electrode 71 is disposed on the channel layer 20. The electrode 71 may cover the group III-V layer 51. A portion of the electrode 71 may be disposed on the group III-V layer 51. A portion of the electrode 71 may be in contact with the surface 511 of the group III-V layer 51. The electrode 71 may be in contact with the surface 513. The surface 512 is exposed from the electrode 71. The electrode 71 is not in direct contact with the surface 512 of the group III-V layer 51. The electrode 71 may penetrate the barrier layer 30. The electrode 71 may extend into the barrier layer 30. The electrode 71 may extend into the channel layer 20. The electrode 71 may be in contact with the channel layer 20. As shown in FIG. 1, the electrode 71 may have a reversed L shape. More specifically, the electrode 71 may have a main portion disposed on the channel layer 20 and a protruding portion extending from the main portion to above the surface 511 of the group III-V layer 51. The protruding portion of the electrode 71 may function as a field plate.

The electrode 71 may include Ni, Cu, Au, Pt, Pd, W, Ti, TiN or other suitable materials. The electrode 71 may include a single layer structure. The electrode 71 may include a multilayer structure. For example, the electrode 71 may include a lower layer including Ni, TiN, Au, Pt, Pd, W and an upper layer including Ti, Al, Ni, Cu, TiN, Au, Pt, Pd, W or an alloy thereof. The electrode 71 may function as an anode of a diode.

The electrode 71 may have a surface 711. The surface 711 may also be referred to as an upper surface of the electrode 71. The surface 711 of the electrode 71 may have a height exceeding a height of the surface 611 of the electrode 61.

The group III-V layer 51, the barrier layer 30 and the channel layer 20 may function as a PIN diode A1. The electrode 71 and the channel layer 20 may function as a Schottky barrier diode A2. The PIN diode A1 and the Schottky diode A2 may be operated under forward and reverse bias, respectively.

For example, when the semiconductor device structure 1a is operated under forward bias between the electrode 61 and the electrode 71, turn-on voltage is dominated by the Schottky diode A2, which can have a relatively low turn-on voltage than that of the PIN diode.

For example, when the semiconductor device structure 1a is operated under reverse bias, a relatively high depletion region is formed under the group III-V layer 51. Under reverse bias, the 2DEG region 40 may include a region 401, corresponding to relatively high depletion region, in which some electrons are depleted and a region 402 in which electrons are substantially not depleted. Since the current flows from region 402 to region 401 under revers bias, the current may exit the electrode 71 through the PIN diode A1 instead of the Schottky diode A2. The relatively high depletion region 401, which has a high resistance, may protect or shield the Schottky contact (which can be formed between the electrode 71 and the channel layer 20) from overvoltage. In such case, the PIN diode A1 and the 2DEG region 40 may provide the conductive path between the electrode 61 and the electrode 71. That is, the breakdown voltage is dominated by the PIN diode A1, which has higher breakdown voltage than Schottky barrier diode A2. Thus, the semiconductor device structure 1a may simultaneously have a lower turn-on voltage and a higher breakdown voltage.

Figure 1A:
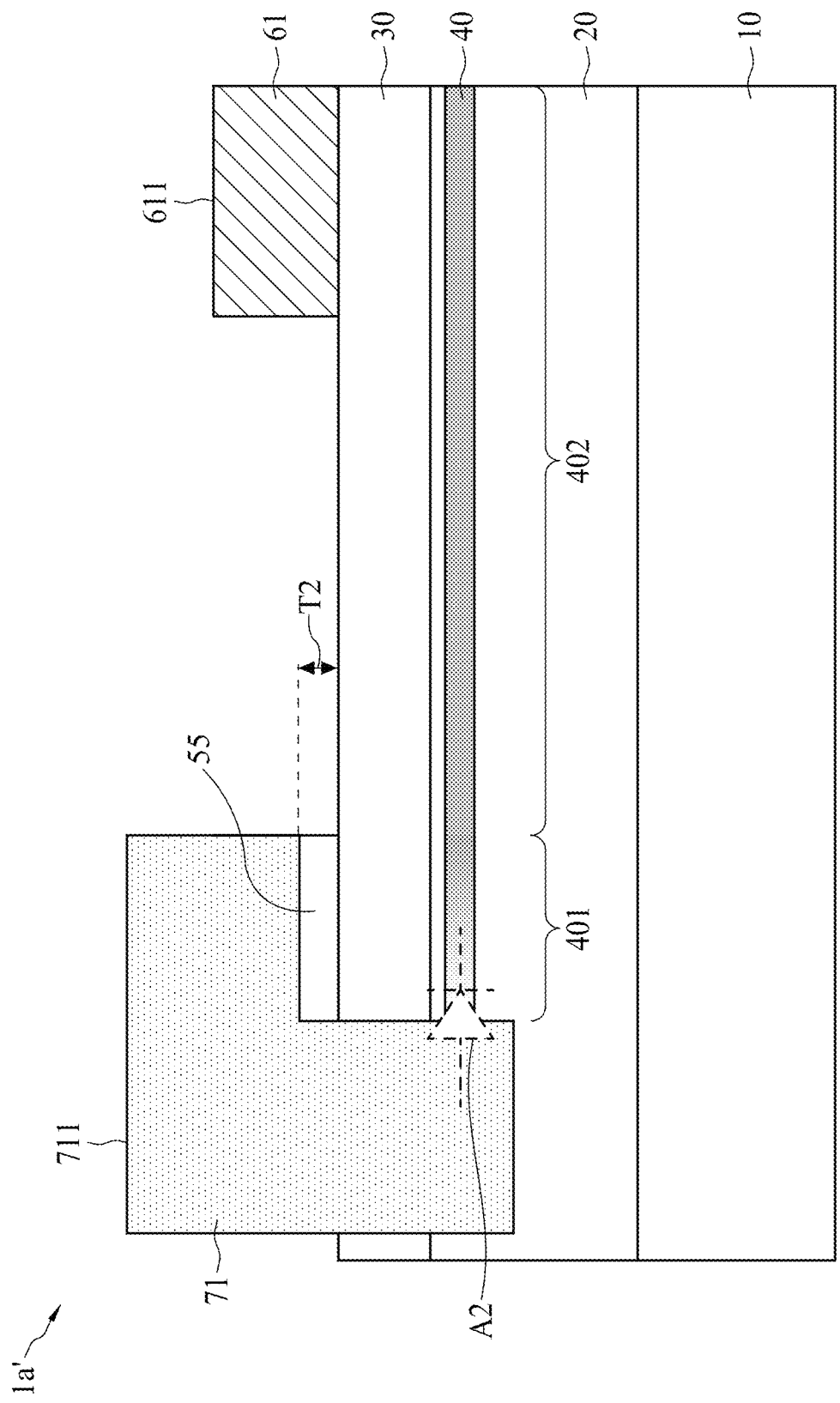
FIG. 1A is a cross-sectional view of a semiconductor device structure in accordance with some other embodiments of the present disclosure.

FIG. 1A is a cross-sectional view of a semiconductor device structure 1a' according to some other embodiments of the present disclosure. The semiconductor device structure 1a' has a structure similar to or the same as the semiconductor device structure 1a as described and illustrated with reference to FIG. 1, except that the group III-V layer 51 as shown in FIG. 1 is replaced by a dielectric layer 55. The dielectric layer 55 may include, for example, a silicon dioxide layer. The dielectric layer 55 may have a thickness T2 ranging from approximately 5 nm to approximately 20 nm. In the semiconductor device structure 1a', a field plate (e.g., the portion of the electrode 71 directly over the dielectric layer 55) can be used to improve breakdown voltage (e.g. to pull up breakdown voltage). However, even with the field plate, such semiconductor device structure 1a' can still have relatively high leakage current when working or operating at a relatively low reverse bias voltage if the dielectric layer 55 has a relatively great thickness. Moreover, a relatively thin insulation layer (e.g., with a thickness from approximately 5 nm to approximately 20 nm) is vulnerable or subject to rupture, which can adversely affect manufacture of the semiconductor device structure 1a'.

Referring back to FIG. 1, the semiconductor device structure 1a can work effectively at a relatively less reverse bias voltage of approximately zero volt but have a relatively great breakdown voltage. In addition, the thickness of the group III-V layer 51, which can deplete electrons even without any bias, can be relatively great while maintaining a low leakage current. In other words, the semiconductor device structure 1a can be relatively robust. Further, the semiconductor device structure 1a may have a relatively great breakdown voltage because the breakdown voltage is determined by the PIN diode A1 under reverse bias.

Figure 2:
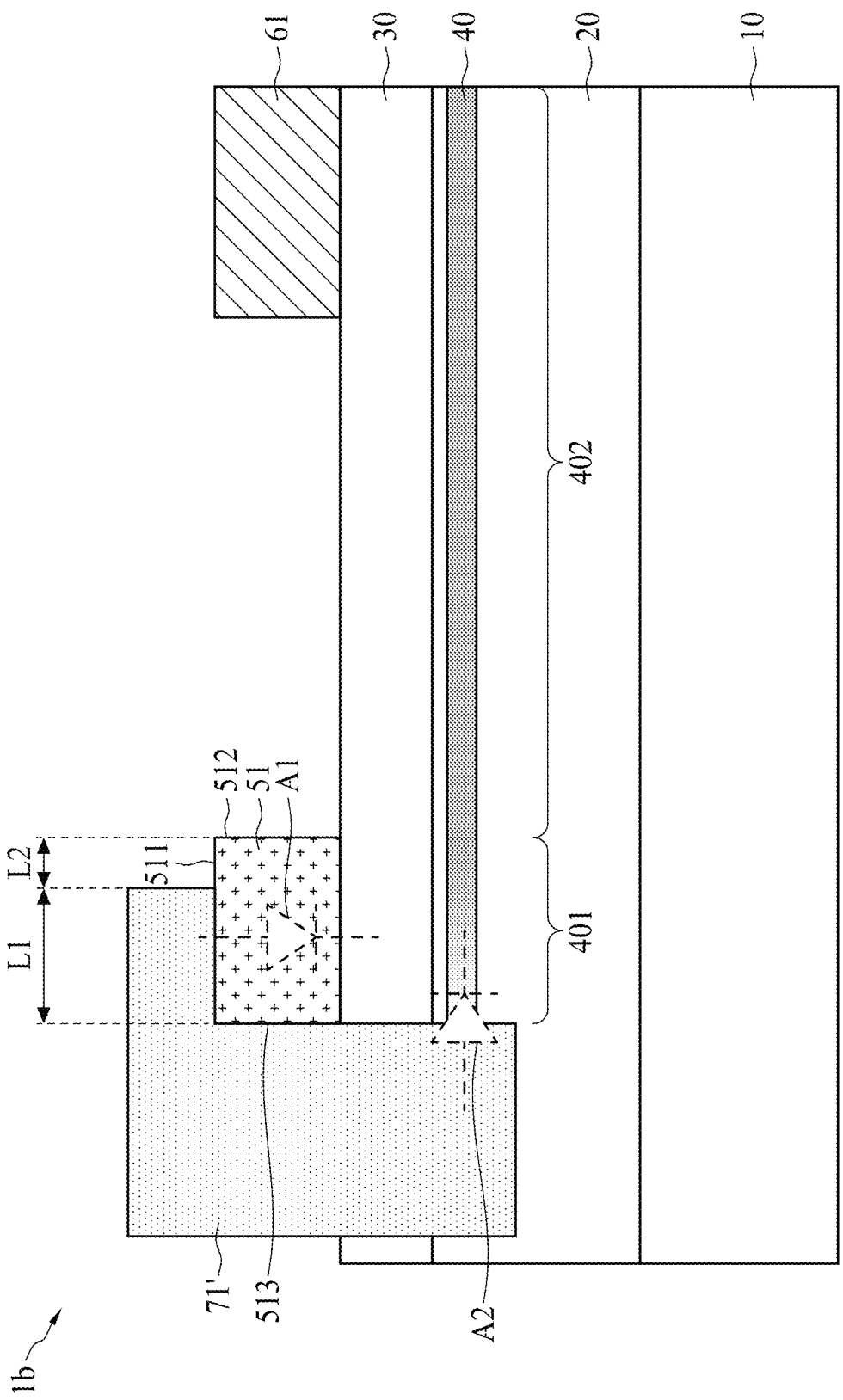
FIG. 2 is a cross-sectional view of a semiconductor device structure in accordance with some embodiments of the present disclosure.

FIG. 2 is a cross-sectional view of a semiconductor device structure 1b in accordance with some embodiments of the present disclosure.

The semiconductor device structure 1b has a structure similar to or the same as the semiconductor device structure 1a of FIG. 1, with one difference being that the group III-V layer 51 is not completely covered by the electrode 71'.

A portion of the surface 511 of the group III-V layer 51 is exposed from the electrode 71'. More specifically, a portion of the group III-V layer 51 is exposed from the protruding portion of the electrode 71'. As shown in FIG. 2, a width L1 is covered by the electrode 71', and a width L2 is exposed from the electrode 71'. The ratio between L1 and L2 may range from about 30:70 to about 50:50. The ratio between L1 and L2 may range from about 50:50 to about 70:30. The ratio between L1 and L2 may range from about 70:30 to about 99:1. The ratio between the width L1 and width L2 may affect the performance of the device. For example, the ratio may change or affect the turn-on resistance. For example, the ratio may change or affect the leakage current.

Figure 3:
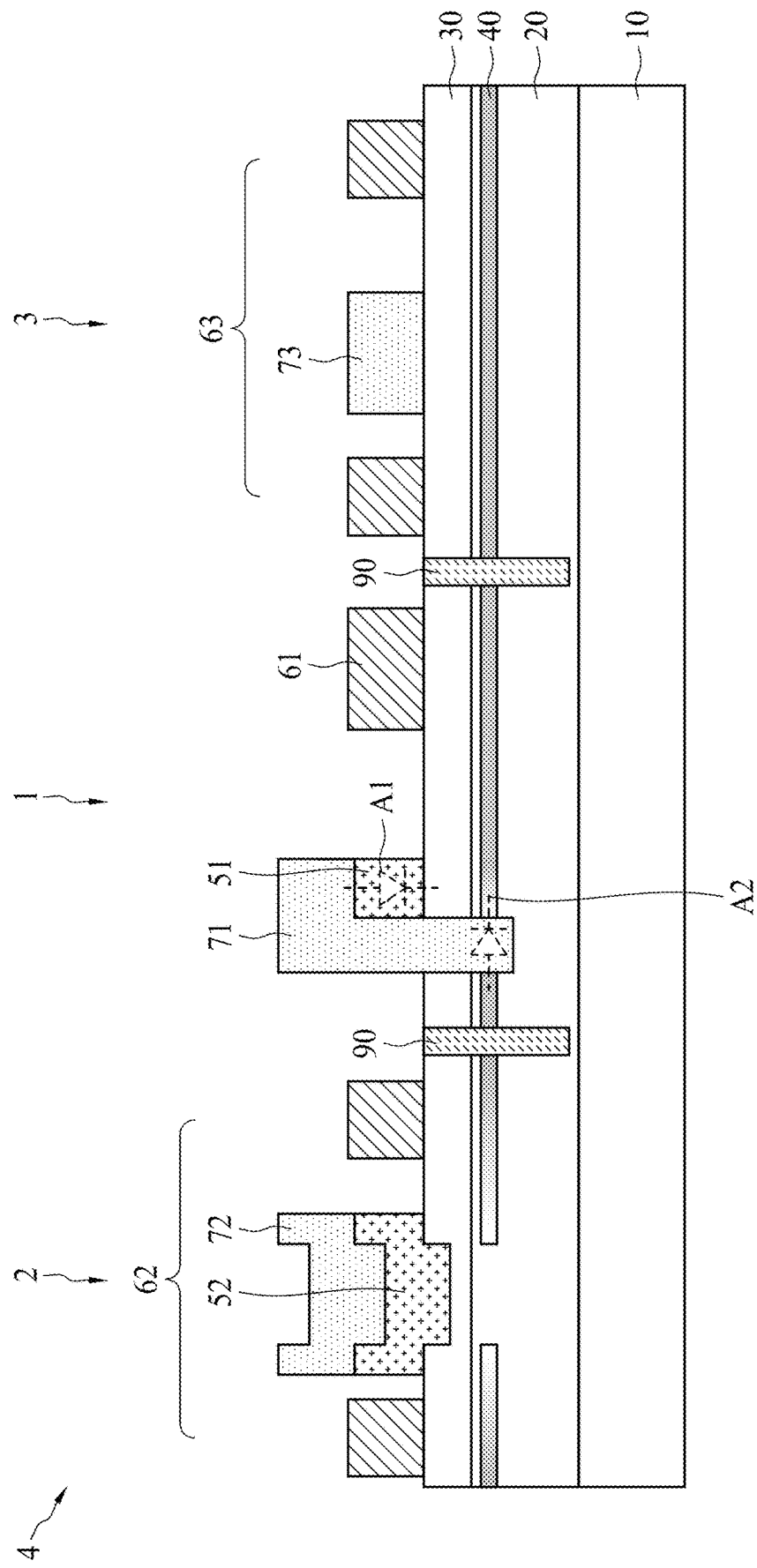
FIG. 3 is a cross-sectional view of a semiconductor device structure in accordance with some embodiments of the present disclosure.

FIG. 3 is a cross-sectional view of a semiconductor device structure 4 in accordance with some embodiments of the present disclosure.

The semiconductor device structure 4 can include a device 1. The semiconductor device structure 4 can include a device 2. The semiconductor device structure 4 can include a device 3. The device 1 may include the semiconductor device structure 1a as described and illustrated with reference to FIG. 1. The device 1 may include the semiconductor device structure 1a as described and illustrated with reference to FIG. 2. The device 1 may be integrated with the device 2 or 3. For example, the device 1, the device 2 and the device 3 may share the substrate 10, the channel layer 20 and the barrier layer 30.

The device 2 may be disposed adjacent to the device 1. The device 2 may be separated from the device 1 by an isolation structure 90. The device 2 may include a substrate 10, a channel layer 20, a barrier layer 30, a p-doped layer 52 or a depletion layer 52, a source and drain structure (or S/D structure) 62 and a gate 72. The device 2 may be an enhancement-mode HEMT, which is preset to be in an OFF state when the gate 72 is in a zero bias state.

The depletion layer 52 may be disposed on the barrier layer 30. In addition, a portion of the depletion layer 52 may be disposed in a recess defined by the barrier layer 30 in order to completely deplete the 2DEG region 40 directly under the recess. The depletion layer 52 may include p-doped GaN layer, p-doped AlGaN layer, p-doped AlN layer or other suitable III-V group layers. The material of the depletion layer 52 may be the same as that of the group III-V layer 51. At least a portion of an upper surface of the depletion layer 52 may be elevationally the same as the upper surface of the group III-V layer 51. At least a portion of an upper surface of the depletion layer 52 may be elevationally the same as the upper surface of the electrode 61.

The source and drain structure 62 may be disposed on the barrier layer 30. The source and drain structure 62 may include Ti, Al, Ni, Cu, Au, Pt, Pd, W, TiN or other suitable materials. The material of the source and drain structure 62 may be the same as that of the electrode 61. An upper surface of the source and drain structure 62 may be elevationally the same as the upper surface of the electrode 61. The upper surface of the source and drain structure 62 may be elevationally the same as the upper surface of the group III-V layer 51.

The gate 72 may be disposed on the depletion layer 52. The gate 72 may include Ni, Cu, Au, Pt, Pd, W, Ti, TiN or other suitable materials. The material of the gate 72 may be the same as that of the electrode 71. At least a portion of an upper surface of the gate 72 may be elevationally the same as the upper surface of the electrode 71.

The device 3 may be disposed adjacent to the device 1. The device 3 may be separated from the device 1 by the isolation structure 90. The device 3 may include a substrate 10, a channel layer 20, a barrier layer 30, a source and drain structure 63 and a gate 73. The device 3 may be a depletion-mode HEMT, which is preset to be in an On state when the gate 73 is in a zero bias state.

The source and drain structure 63 may be disposed on the barrier layer 30. The source and drain structure 63 may include Ti, Al, Ni, Cu, Au, Pt, Pd, W, TiN or other suitable materials. The material of the source and drain structure 63 may be the same as that of the electrode 61. An upper surface of the source and drain structure 63 may be elevationally the same as the upper surface of the electrode 61. The upper surface of the source and drain structure 63 may be elevationally the same as the upper surface of the group III-V layer 51.

The gate 73 may be disposed on the barrier layer 30. The gate 73 may include Ni, Cu, Au, Pt, Pd, W, Ti, TiN or other suitable materials. The material of the gate 73 may be the same as that of the electrode 71. An upper surface of the gate 73 may be lower than the upper surface of the electrode 71.

The semiconductor device structure 4 can include an integrated circuit, which can include HEMTs (e.g. devices 2 and 3) and diodes (e.g. the device). In other words, transistors and diodes can be integrated in a monolithic GaN structure, which is beneficial to miniaturization FIG. 4A, FIG. 4B, FIG. 4C, FIG. 4D and FIG. 4E illustrate various stages of a method for manufacturing a semiconductor device structure 1a in accordance with some embodiments of the present disclosure.

Figure 4A:
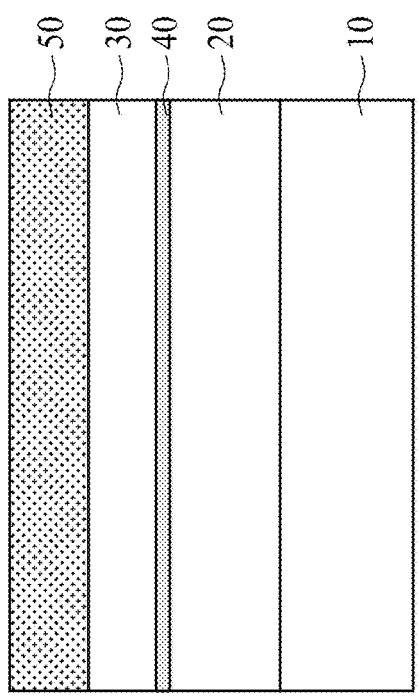
FIG. 4A, FIG. 4B, FIG. 4C, FIG. 4D and FIG. 4E illustrate various stages of a method for manufacturing a semiconductor device structure in accordance with some embodiments of the present disclosure.

Referring to FIG. 4A, a substrate 10 is provided. A channel layer 20, a barrier layer 30 and a semiconductor layer 50 are formed on the substrate 10. The channel layer 20, barrier layer 30 and/or semiconductor layer 50 may be formed by metal organic chemical vapor deposition (MOCVD), metal organic vapor-phase epitaxy (MOVPE), epitaxial growth, or other suitable processes.

The semiconductor layer 50 may include p-type dopants. The semiconductor layer 50 may include p-doped GaN layer, p-doped AlGaN layer, p-doped AlN layer or other suitable semiconductor layers with p-type dopants. The p-type dopants may include at least one of Mg, Be, Zn and Cd. The semiconductor layer 50 may be treated by oxygen and/or nitrogen at a temperature above 600° C. in order to activate the semiconductor layer 50. After the semiconductor layer 50 is activated, the bonding between p-type dopant and hydrogen—such as Mg—H bonding—in the semiconductor layer 50 may be broken, thereby providing holes to exhaust electrons in the 2DEG region 40.

Figure 4B:
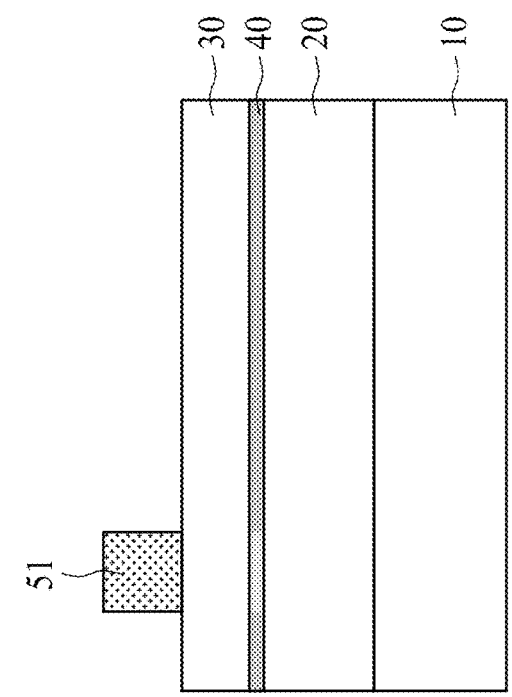

Referring to FIG. 4B, the semiconductor layer 50 may be patterned to form a group III-V layer 51. The semiconductor layer 50 may be patterned by an etching process.

Figure 4C:
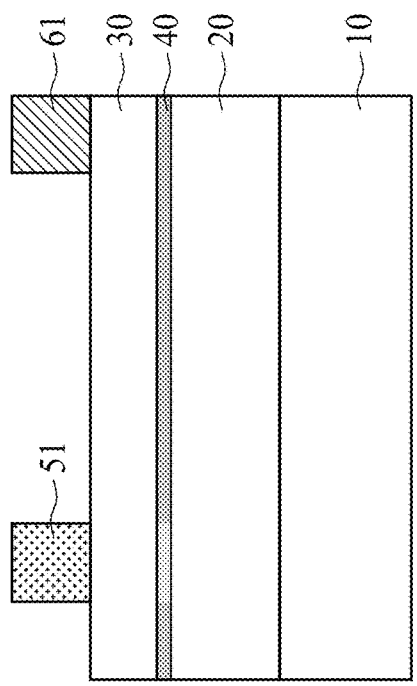

Referring to FIG. 4C, an electrode 61 is formed on the barrier layer 30 and adjacent to the group III-V layer 51. The electrode 61 may be formed by a chemical vapor deposition (CVD) process, a physical vapor deposition process (PVD), an atomic layer deposition (ALD) process, and a sputter process or other suitable process.

Figure 4D:
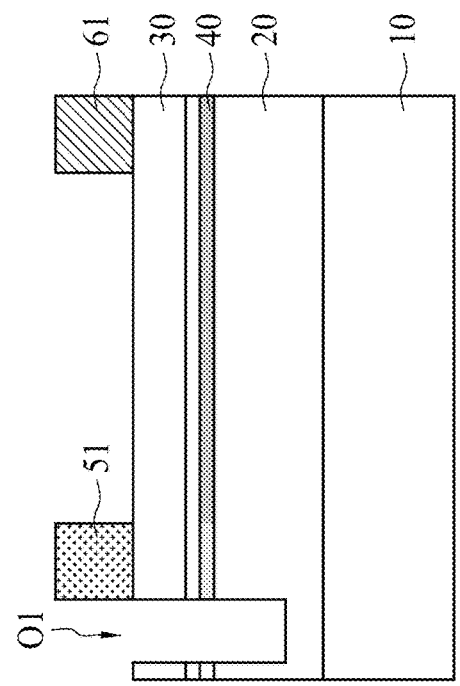

Referring to FIG. 4D, an opening O1 is formed. The opening O1 may penetrate the barrier layer 30. The opening O1 may expose the channel layer 20. The opening O1 may be formed by performing one or more etching processes to remove a portion of the barrier layer 30 and the channel layer 20.

Figure 4E:
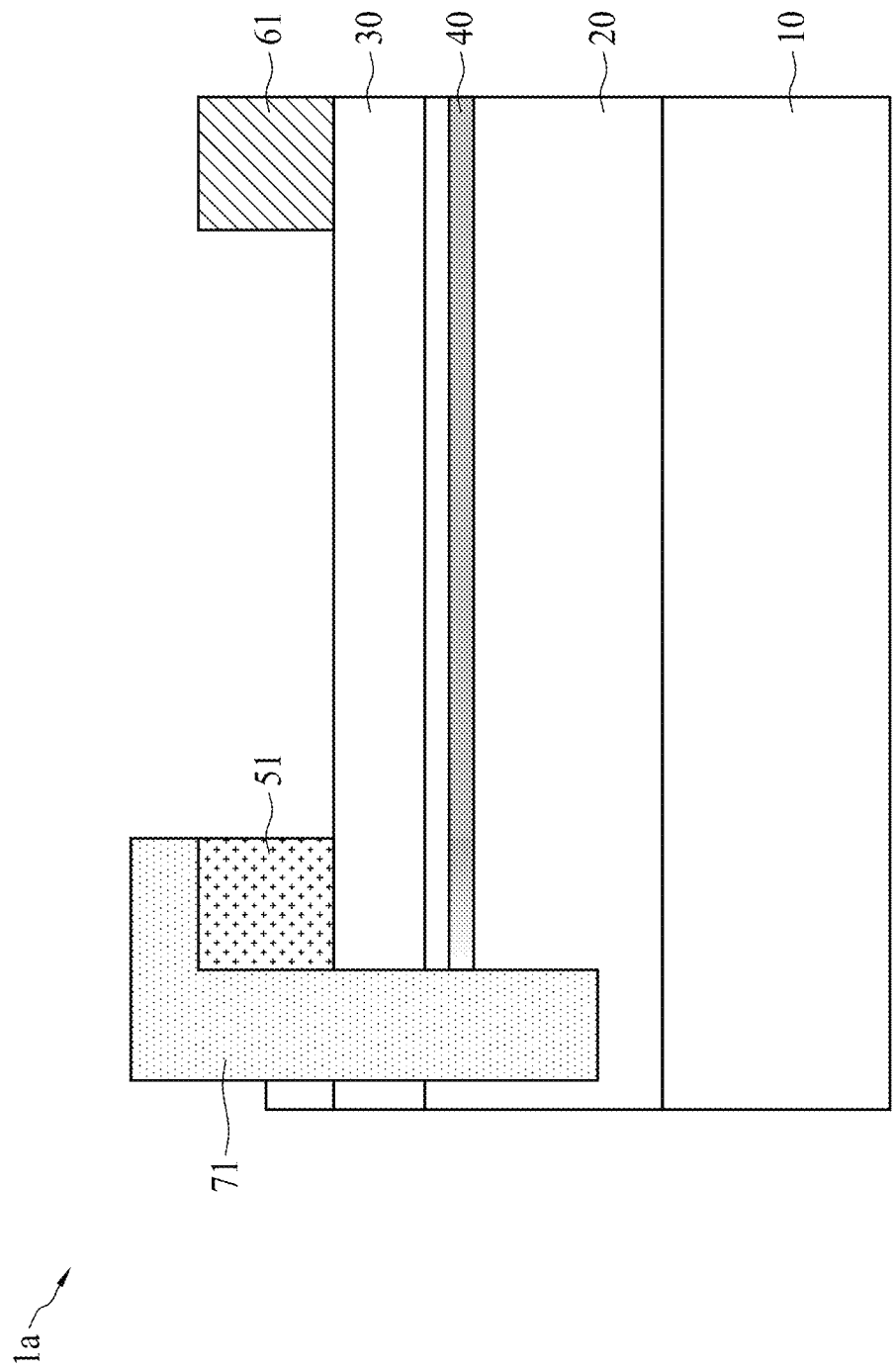

Referring to FIG. 4E, an electrode 71 is formed to fill the opening O1 and cover the upper surface of the group III-V layer 51. As a result, a semiconductor device structure 1a is produced. The electrode 71 may be formed by a CVD, PVD, ALD, sputter or other suitable processes.

FIG. 5A, FIG. 5B, FIG. 5C, FIG. 5D, FIG. 5E, FIG. 5F, FIG. 5G, FIG. 5H, FIG. 5I and FIG. 5J illustrate various stages of a method for manufacturing a semiconductor device structure 4 in accordance with some embodiments of the present disclosure.

Figure 5A:
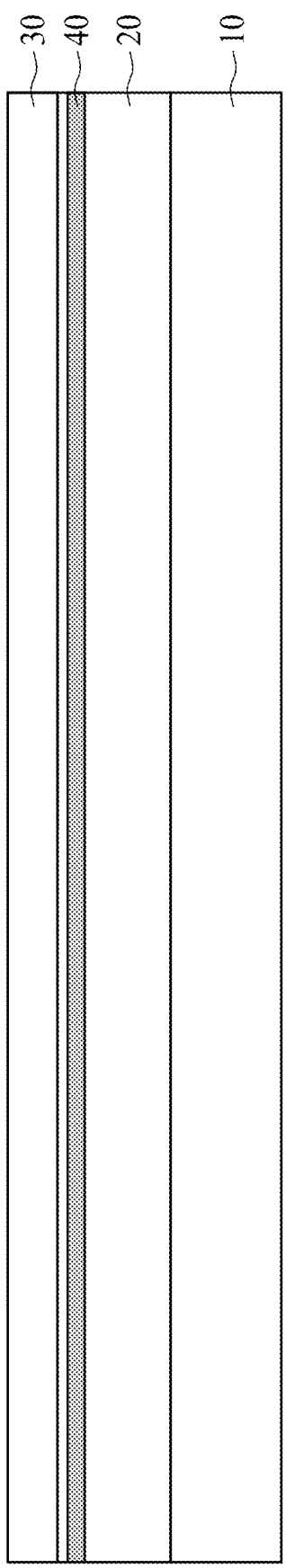
FIG. 5A, FIG. 5B, FIG. 5C, FIG. 5D, FIG. 5E, FIG. 5F, FIG. 5G, FIG. 5H, FIG. 5I and FIG. 5J illustrate various stages of a method for manufacturing a semiconductor device structure in accordance with some embodiments of the present disclosure.

Referring to FIG. 5A, a substrate 10 is provided. A channel layer 20 and a barrier layer 30 are formed on the substrate 10.

Figure 5B:
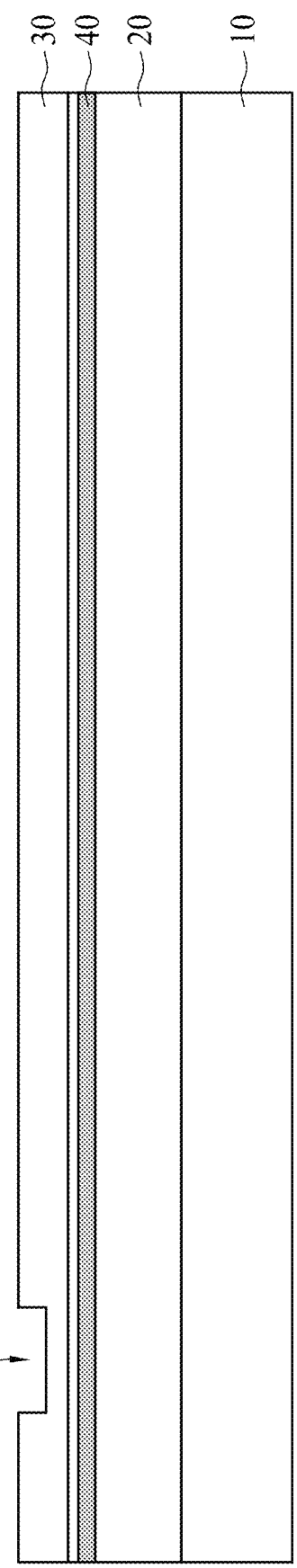

Referring to FIG. 5B, an opening O2 is formed. The opening O2 may be formed by performing an etching process on the barrier layer 30. The barrier layer 30 may have an upper surface corresponding to an unetched region and a lower surface corresponding to an etched region.

Figure 5C:
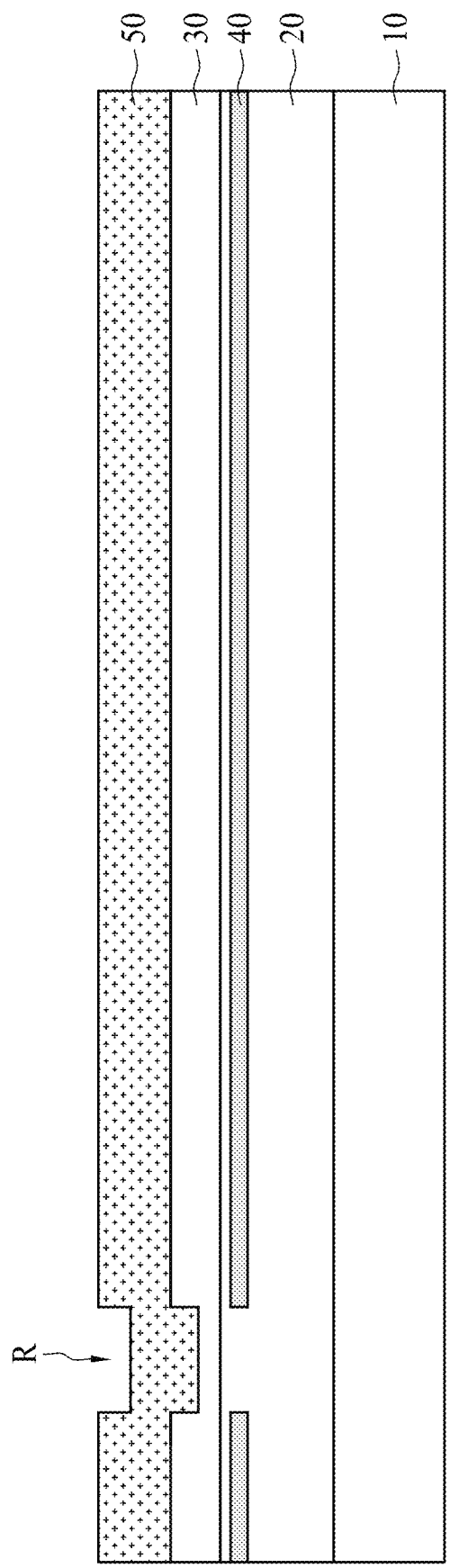

Referring to FIG. 5C, a semiconductor layer 50 is formed to cover the barrier layer 30. The semiconductor layer 50 may fill the opening O2. The semiconductor layer 50 may include a recess R corresponding to the etched region of the barrier layer 30. The semiconductor layer 50 may be activated by treating with oxygen and/or nitrogen.

Figure 5D:
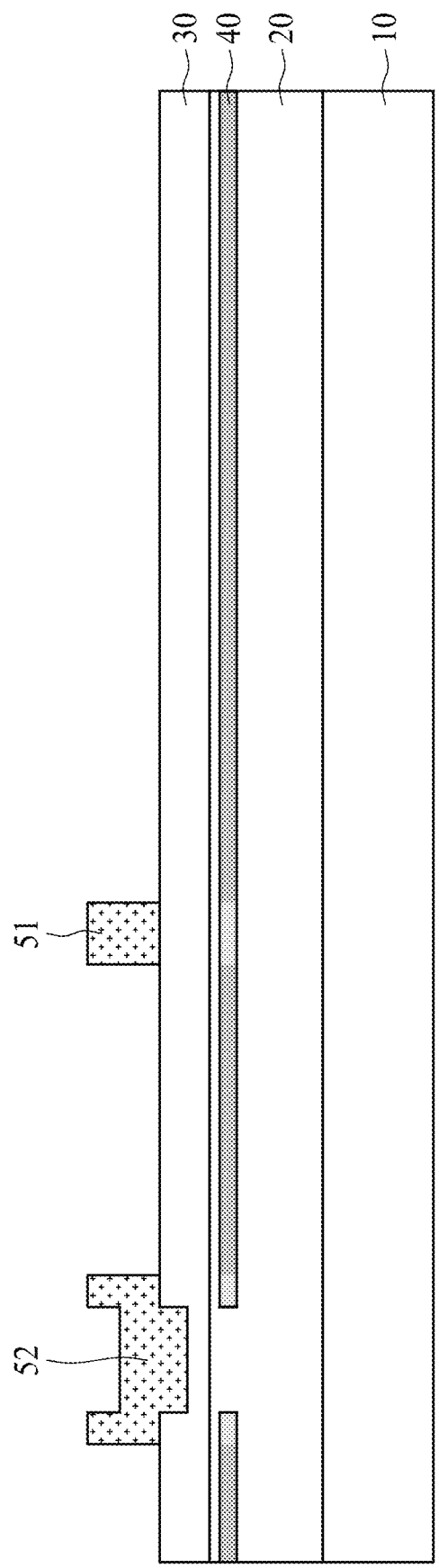

Referring to FIG. 5D, a semiconductor layer 50 is patterned to form a group III-V layer 51 and an depletion layer 52.

Figure 5E:
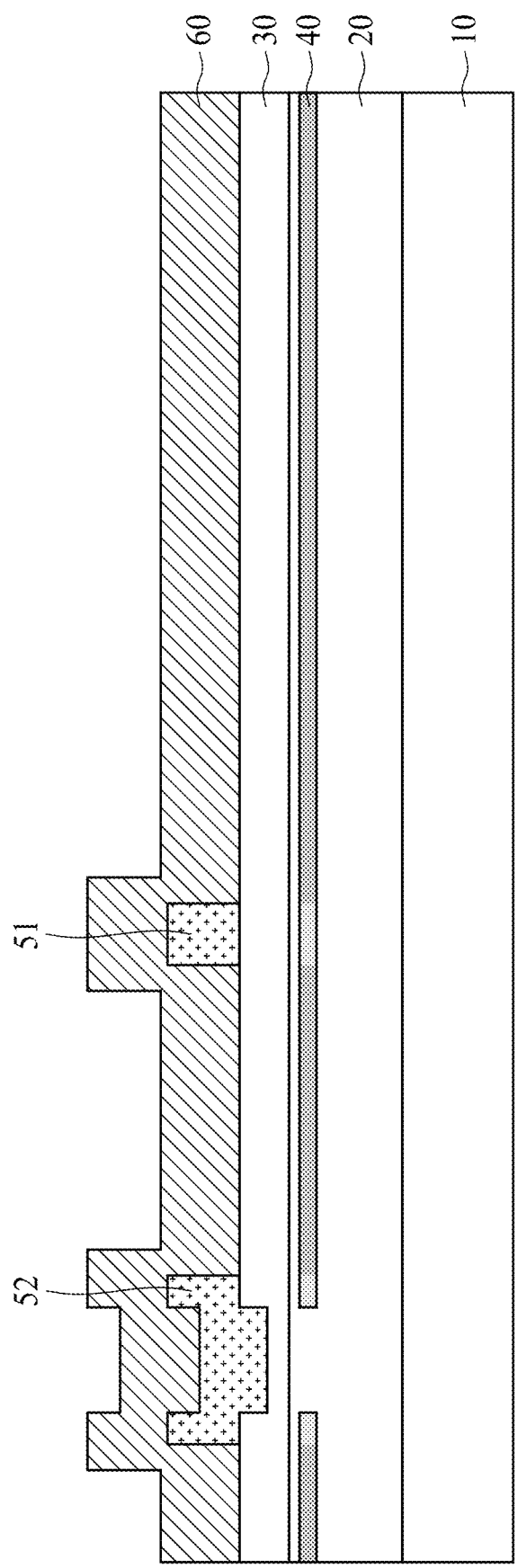

Referring to FIG. 5E, a conductive layer 60 is formed to cover the group III-V layer 51, the depletion layer 52 and an upper surface of the barrier layer 30. The conductive layer 60 may include Ti, Al, Ni, Cu, Au, Pt, Pd, W, TiN or other suitable materials. The conductive layer 60 may include a single layer or a multilayer. The process of forming the conductive layer 60 may be the same as or similar to that of the electrode 61.

Figure 5F:
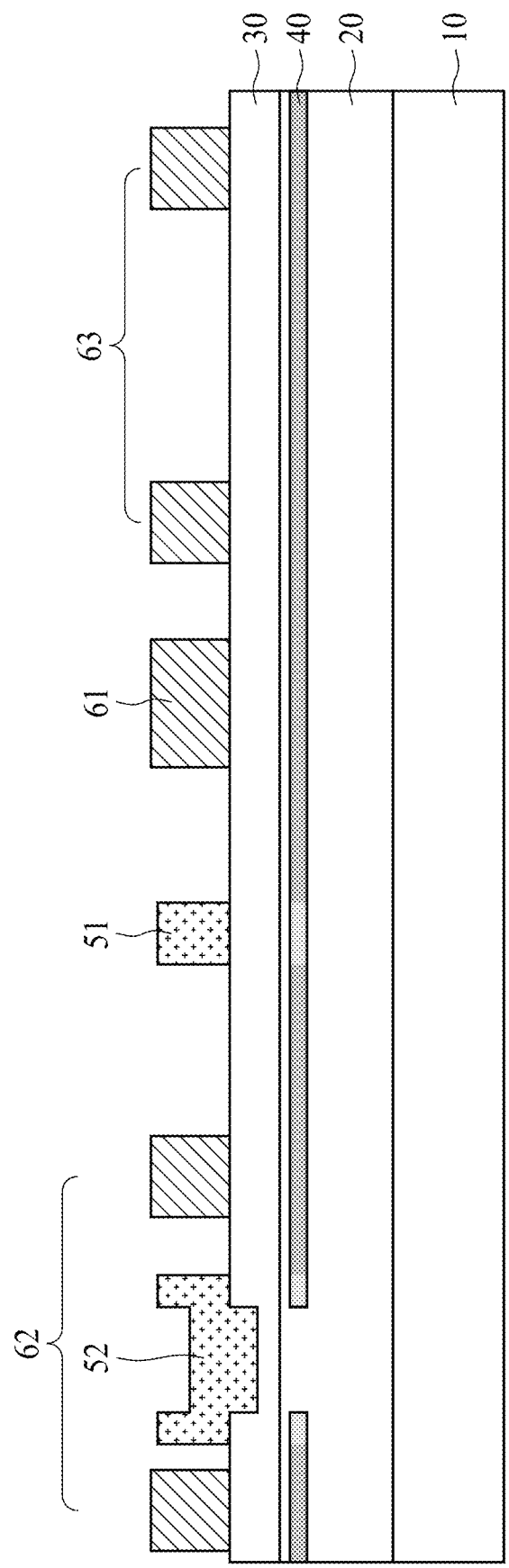

Referring to FIG. 5F, the conductive layer 60 is patterned to form the electrode 61, the source and drain structure 62 and the source and drain structure 63. The electrode 61, the source and drain structure 62 and the source and drain structure 63 may have upper surfaces that are elevationally the same.

Figure 5G:
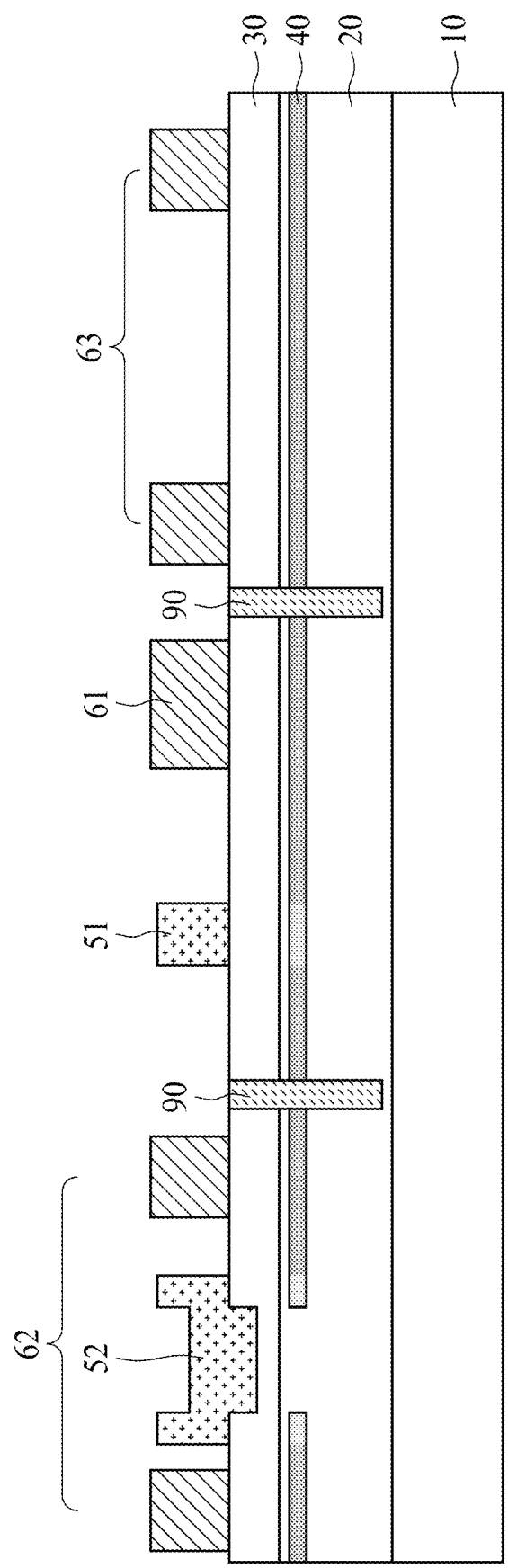
Figure 5H:
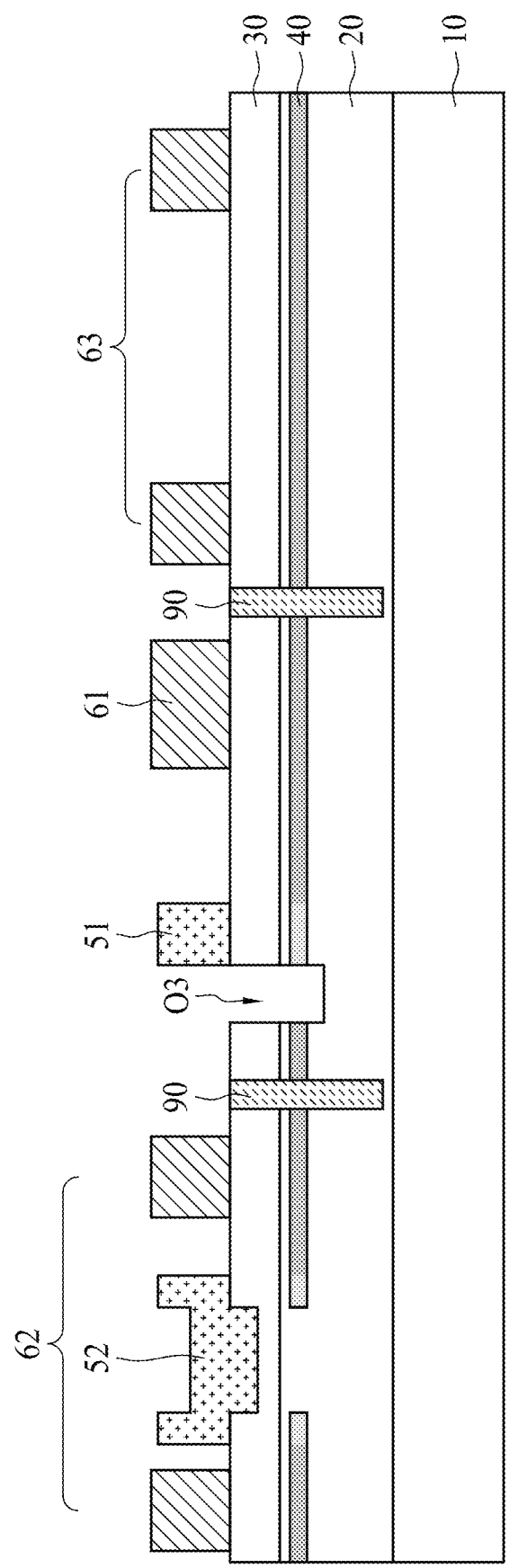
Figure 5I:
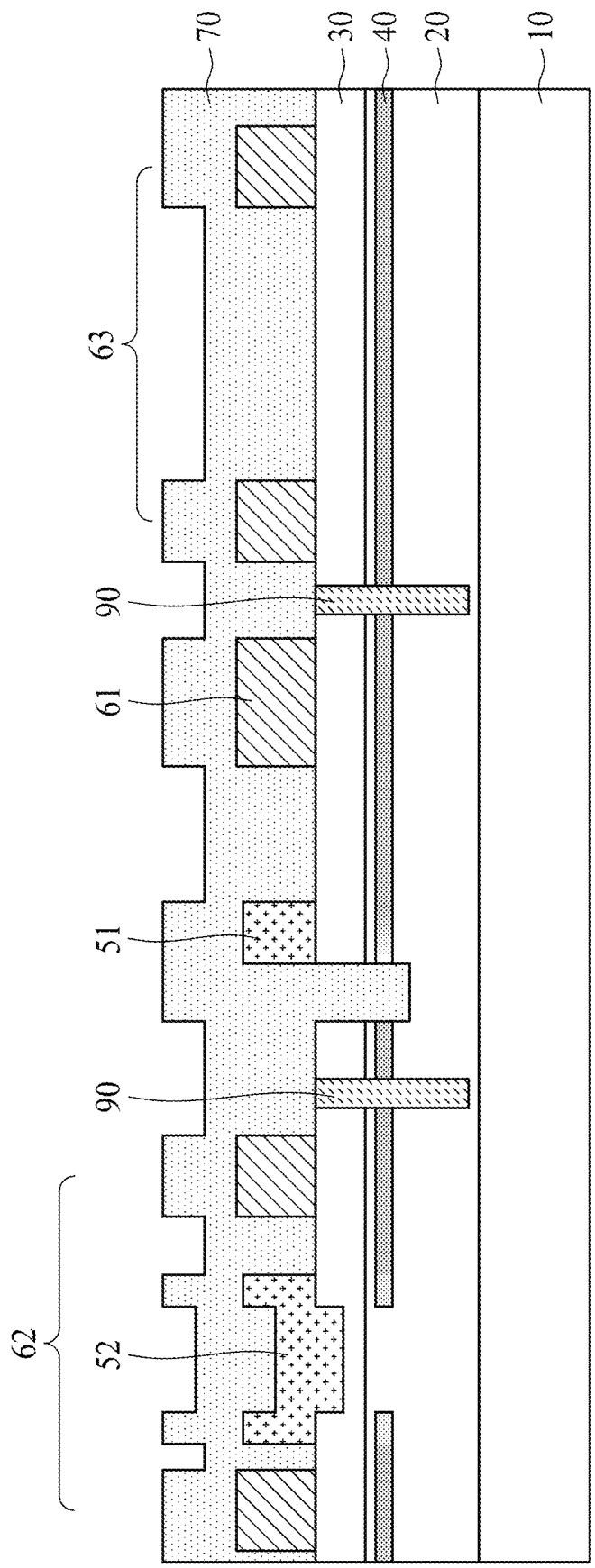
Figure 5J:
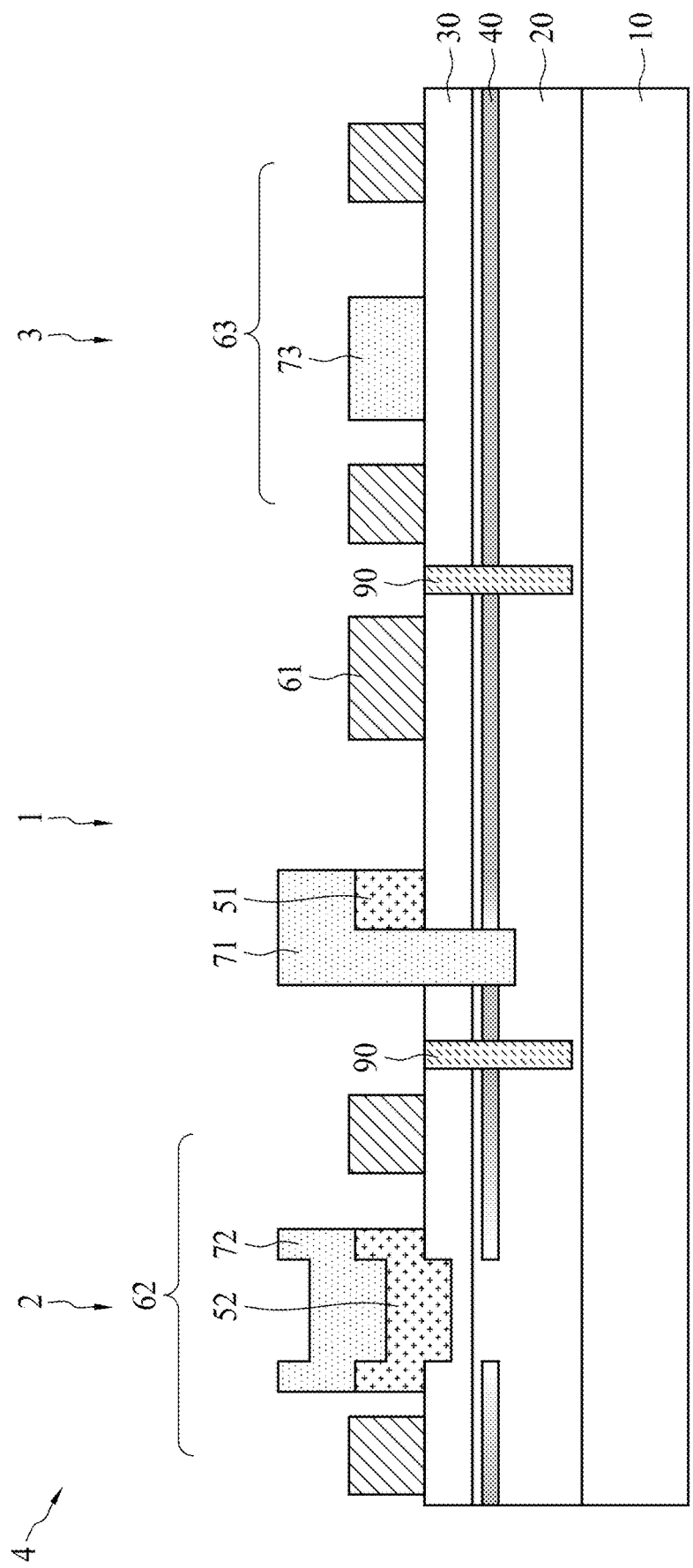

Referring to FIG. 5G, isolation structures 90 are formed to define regions of different devices, such as devices 1, 2 and 3 shown in FIG. 5J. A plurality of the openings may be formed, and a dielectric layer may be filled into the opening to form the isolation structure 90.

Referring to FIG. 5H, an opening O3 may be formed. The opening O3 may expose the side surfaces of the barrier layer 30 and the channel layer 20. The opening O3 may expose a portion of the channel layer 20. The opening O3 may penetrate the barrier layer 30. The opening O3 may abut the group III-V layer 51.

Referring to FIG. 5I, a conductive layer 70 is formed to cover the group III-V layer 51, the depletion layer 52, the electrode 61, the source and drain structure 62, the source and drain structure 63 and the barrier layer 30. The conductive layer 70 may fill the opening O3. The conductive layer 70 may be in contact with a portion of the channel layer 20. The conductive layer 70 may include Ti, Al, Ni, Cu, TiN, Au, Pt, Pd, W or an alloy thereof. The conductive layer 70 may include a single layer or a multilayer. The process of forming the conductive layer 70 may be the same as or similar to that of the electrode 71.

Referring to FIG. 5J, the conductive layer 70 is patterned to form the electrode 71, the gate 72 and the gate 73. As a result, the devices 1, 2 and 3 are formed, and the semiconductor device structure 4 is produced.

FIG. 5A to FIG. 5J illustrate an example to integrate the process of manufacturing the diode structure, such as the device 1, and the HEMT structure, such as the devices 2 and 3. Therefore, the process for forming the semiconductor device structure 4 may be simplified.

As used herein, spatially relative terms, such as "beneath," "below," "lower," "above," "upper," "lower,"

"left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately," "substantially," "substantial" and "about" are used to describe and account for small variations. When used in conjunction with an event or circumstance, the terms can refer to instances in which the event of circumstance occurs precisely as well as instances in which the event or circumstance occurs to a close approximation. As used herein with respect to a given value or range, the term "about" generally refers to within ±10%, ±5%, ±1%, or ±0.5% of the given value or range. Ranges can be expressed herein as being from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 within within 1 or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device structure, comprising:
a substrate;
a first nitride semiconductor layer disposed on the substrate;
a second nitride semiconductor layer disposed on the first nitride semiconductor layer and having a bandgap greater than that of the first nitride semiconductor layer;
a third nitride semiconductor layer disposed on the second nitride semiconductor layer;
a first electrode disposed on the second nitride semiconductor layer and horizontally spaced apart from the third nitride semiconductor layer; and
a second electrode covering an upper surface of the third nitride semiconductor layer and in direct contact with the first nitride semiconductor layer,
wherein the second electrode has a reversed L shape, and comprises a first part covering the third nitride semiconductor layer, and a second part penetrating the second nitride semiconductor layer and extending into the first nitride semiconductor layer, wherein a depth of the extending is less than a thickness of the first nitride semiconductor layer.

2. The semiconductor device structure of claim 1, wherein the third nitride semiconductor layer comprises p-type dopant.

3. The semiconductor device structure of claim 1, wherein the third nitride semiconductor layer comprises at least one of p-doped GaN layer, p-doped AlGaN layer and p-doped AlN layer.

4. The semiconductor device structure of claim 1, wherein a portion of the upper surface of the third nitride semiconductor layer is exposed from the second electrode.

5. The semiconductor device structure of claim 1, wherein the third nitride semiconductor layer comprises a first side surface adjacent to the first electrode exposed from the second electrode.

6. The semiconductor device structure of claim 5, wherein the third nitride semiconductor layer comprises a second side surface opposite to the first side surface, and the second side surface is in direct contact with the second electrode.

7. The semiconductor device structure of claim 1, wherein the third nitride semiconductor layer, the second nitride semiconductor layer and the first nitride semiconductor layer function as a PIN diode.

8. The semiconductor device structure of claim 1, wherein the second electrode and the first nitride semiconductor layer function as a Schottky diode.

9. The semiconductor device structure of claim 1, wherein the first electrode is disposed at an elevation substantially the same as the third nitride semiconductor layer.

10. The semiconductor device structure of claim 1, wherein the second electrode is disposed at an elevation substantially greater than the first electrode.

11. The semiconductor device structure of claim 1, wherein the first electrode has an upper surface elevationally the same as the upper surface of the third nitride semiconductor layer.

12. A semiconductor device structure, comprising:
a substrate; and
a first device disposed on the substrate, comprising:
a first nitride semiconductor layer disposed on the substrate;
a second nitride semiconductor layer disposed on the first nitride semiconductor layer and having a bandgap greater than that of the first nitride semiconductor layer;
a third nitride semiconductor layer disposed on the second nitride semiconductor layer;
a first electrode horizontally spaced apart from the third nitride semiconductor layer; and
a second electrode in direct contact with the third nitride semiconductor layer and the first nitride semiconductor layer,
wherein the second electrode has a reversed L shape, and comprises a first part covering the third nitride semiconductor layer, and a second part penetrating the second nitride semiconductor layer and extending into the first nitride semiconductor layer, wherein a depth of the extending is less than a thickness of the first nitride semiconductor layer; and
a second device disposed on the substrate and electrically connected to the first device.

13. The semiconductor device structure of claim 12, wherein at least a part of the first nitride semiconductor layer, at least a part of the second nitride semiconductor layer and at least a part of the third nitride semiconductor layer function as a PIN diode.

14. The semiconductor device structure of claim 12, wherein a combination of at least a part of the second electrode and at least a part of the first nitride semiconductor layer function as a Schottky diode.

15. The semiconductor device structure of claim 12, wherein the second device comprises an enhancement-mode high electron mobility transistor (HEMT).

16. The semiconductor device structure of claim 12, wherein the second device comprises a depletion-mode HEMT.

17. A method for manufacturing a semiconductor device structure, comprising:
   providing a substrate;
   forming a first nitride semiconductor layer on the substrate;
   forming a second nitride semiconductor layer on the first nitride semiconductor layer;
   forming a third nitride semiconductor layer on the second nitride semiconductor layer;
   forming a first electrode on the second nitride semiconductor layer, wherein the first electrode is horizontally spaced apart from the third nitride semiconductor layer;
   forming an opening penetrating the second nitride semiconductor layer and extending into the first nitride semiconductor layer, wherein a depth of the extending is less than a thickness of the first nitride semiconductor layer; and
   forming a second electrode having a reversed L shape to cover an upper surface of the third nitride semiconductor layer and fill the opening, such that the second electrode is in contact with both the first nitride semiconductor layer and the third nitride semiconductor layer.

* * * * *